United States Patent
Horio

(10) Patent No.: US 7,263,294 B2
(45) Date of Patent: Aug. 28, 2007

(54) INFRARED DATA COMMUNICATION MODULE AND METHOD OF MAKING THE SAME

(75) Inventor: Tomoharu Horio, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 683 days.

(21) Appl. No.: 10/127,657

(22) Filed: Apr. 23, 2002

(65) Prior Publication Data
US 2002/0154366 A1    Oct. 24, 2002

(30) Foreign Application Priority Data
Apr. 24, 2001    (JP)    ............... 2001-126100

(51) Int. Cl.
*H04B 10/00*    (2006.01)
(52) U.S. Cl. .................. 398/128; 398/138; 398/164
(58) Field of Classification Search ........ 398/128–131, 398/138, 164; 257/80–84, 98–99; 385/14; 455/73
See application file for complete search history.

(56) References Cited

U.S. PATENT DOCUMENTS

| | | | | |
|---|---|---|---|---|
| 4,469,780 A | * | 9/1984 | Hirai et al. ................. | 430/373 |
| 4,493,889 A | * | 1/1985 | Mihara et al. .............. | 430/572 |
| 5,391,887 A | * | 2/1995 | Murray, Jr. .............. | 250/506.1 |
| 6,169,295 B1 | * | 1/2001 | Koo ............................ | 257/81 |
| 6,497,588 B1 | * | 12/2002 | Scharf et al. ............... | 439/607 |
| 2002/0005819 A1 | * | 1/2002 | Ronzani et al. ................ | 345/8 |

FOREIGN PATENT DOCUMENTS

JP    2001-068722    3/2001

OTHER PUBLICATIONS

English Language Abstract of JP-A-2001-068722.

* cited by examiner

*Primary Examiner*—Dzung Tran
(74) *Attorney, Agent, or Firm*—Michael Bednarek; Paul, Hastings, Janofsky & Walker LLP

(57) ABSTRACT

An infrared data communication module includes a substrate having a surface on which a light emitting element, a light receiving element, and an IC element are mounted. A resin package is formed on the substrate for integrally enclosing the light emitting element, the light receiving element and the IC element. A shield member is formed within the resin package for covering the IC element to prevent light-attributable noises from reaching the IC element.

12 Claims, 8 Drawing Sheets

INFRARED DATA COMMUNICATION MODULE AND METHOD OF MAKING THE SAME

BACKGROUND OF THE INVENTION

1. Field of the Invention:

The present invention relates to an infrared data communication module used for performing infrared data communication by IrDA (Infrared Data Association) method. The present invention also relates to a method for making such an infrared data communication module.

2. Description of the Related Art:

Infrared data communication modules are conventionally utilized for performing infrared data communication based on the IrDA (Infrared Data Association) method between different apparatuses such as notebook-size personal computers or mobile phones or between such an apparatus and a peripheral device such as a printer. A prior art infrared data communication module (hereinafter simply referred to as "module") has such a structure as shown in FIGS. 12 and 13. Specifically, the module 1 includes a substrate 3 having a surface 3a formed with a conductor pattern 2, a light emitting element 4, a light receiving element 5, and an IC element 6 mounted at predetermined portions of the conductor pattern 2. The elements 4, 5, 6 are connected, via gold wires W, to predetermined portions of the conductor pattern 2.

The surface 3a of the substrate 3 is upwardly provided with a package 9 formed by molding a resin for integrally sealing the elements 4, 5, and 6. The package 9 has an upper surface 9a formed with a light emitting lens 11 at a location corresponding to the light emitting element 4 and a light receiving lens 12 at a location corresponding to the light receiving element 5. The substrate 3 has a lower surface 3b formed with connection terminals 13 (See FIG. 12) for connection to an external circuit board (not shown) by soldering. The substrate 3 has a side surface 3c formed with grooves 14 for electrically connecting the connection terminals 13 to the conductor pattern 2 on the upper surface 3a of the substrate 3.

In use, the module 1 having the above-described structure is mounted onto a circuit board (not shown) for incorporation in an electronic apparatus (not shown) such as a notebook-size personal computer or a mobile phone.

However, in using the module 1 as a part of such an electronic apparatus, the IC element 6 may be adversely affected by noises generated internally or externally of the apparatus. The internal noises may come from the power source of the apparatus, whereas external noises may include electromagnetic waves (other than light), light from a fluorescent lamp or the sunlight.

The IC element 6 may incorporate an electronic circuit for avoiding the influences of the noises caused by electromagnetic waves. Generally, however, such a circuit is not effective for avoiding the influences of light.

Therefore, as shown in FIG. 14, the module maybe provided with a metallic shield case 28 for blocking light. By the shield case 28, the IC element 6 can be prevented from erroneously operating due to the noises caused by light.

However, the provision of the shield case 28 increases the parts cost of the module 1. Moreover, the process step of attaching a shield case 28 to a module 1 one by one increases the manufacturing cost.

SUMMARY OF THE INVENTION

It is, therefore, an object of the present invention to provide an infrared data communication module which is capable of preventing the IC element from malfunctioning as a result of receiving light noises and which can be manufactured at a relatively low cost.

Another object of the present invention is to provide a method of making such a module.

According to a first aspect of the present invention, there is provided an infrared data communication module comprising a substrate having a surface on which a light emitting element, a light receiving element, and an IC element are mounted. A resin package is formed on the substrate for integrally enclosing the light emitting element, the light receiving element and the IC element. A shield member is formed within the resin package for covering the IC element to protect the IC element against light-attributable noises.

Preferably, the shield member is formed of a light-shielding resin containing an oxide for blocking infrared light and a dye for blocking visible light.

With this structure, the light in the wavelength range of 300-1,000 nm, which includes visible light and infrared light, can be absorptively shielded by the shield member. Specifically, the visible light in the wavelength range of 300-780 nm is absorptively shielded by the dye, whereas the infrared light in the wavelength range of 780-1,000 nm is absorptively shielded by an oxide such as titanium oxide.

The light-shielding resin may further contain carbon black for blocking part of infrared light and part of ultraviolet light. With this structure, the light in a wider wavelength range of 100-1,200 nm can be absorptively shielded by the shield member, because carbon black absorbs the ultraviolet light in the wavelength range of 100-300 nm and the infrared light in the wavelength range of 1,000-1,200 nm.

With the above-described structure, the shield member prevents the light in the above-described wavelength range from reaching the IC element. Therefore, the malfunction of the IC element due to light-attributable noises can be prevented. Thus, the IC element operates stably to control the operation of the light emitting element and the light receiving element, thereby enhancing the reliability of the module. Further, the provision of the shield member eliminates the need for an expensive shield case, which reduces the cost for the parts of the module. Further, in the manufacturing process, the process step for attaching the shield case to the module can be eliminated, which contributes to the shortening of the manufacturing time and the reduction of the manufacturing cost.

Preferably, the light-shielding resin may further contain carbon black for blocking part of infrared light and part of ultraviolet light.

Preferably, the shield member entirely covers the IC element except for a surface thereof contacting the substrate.

Preferably, the shield member has a varying thickness lying in a range of 50-300 μm.

Preferably, the infrared data communication module further comprises a protective member for covering the light emitting element. In this case, the protective member entirely covers the light emitting element except for a surface thereof contacting the substrate.

Preferably, the infrared data communication module may further comprise a protective member for covering the light receiving element. In this case, the protective member covers only an upper surface of the light receiving element.

According to a second aspect of the present invention, a method is provided for making an infrared data communication module comprising a substrate having a surface on which a light emitting element, a light receiving element, and an IC element are mounted; a resin package formed on the substrate for integrally enclosing the light emitting element, the light receiving element and the IC element; and a shield member formed within the resin package for covering the IC element to protect the IC element against light-attributable noises. The method comprises the steps of preparing a light-shielding resin by mixing a thermosetting resin with an oxide for blocking infrared light and a dye for blocking visible light, applying the light-shielding resin to cover the IC element, and heating the applied light-shielding resin for hardening.

Preferably, the resin preparing step comprises adding carbon black to the thermosetting resin for blocking part of infrared light and part of ultraviolet light.

Preferably, the resin applying step comprises applying the light-shielding resin in a gel state to the IC element using a nozzle.

Other features and advantages of the present invention will become clearer from the detailed description given below with reference to the accompanying drawings.

DETAILED DESCRIPTION OF THE PREFERRED EMBODIMENT

Preferred embodiments of the present invention will be described below in detail with reference to the accompanying drawings. In the following description, reference will be made again to FIG. 12 which has been used for describing the prior art module.

Figure 1:
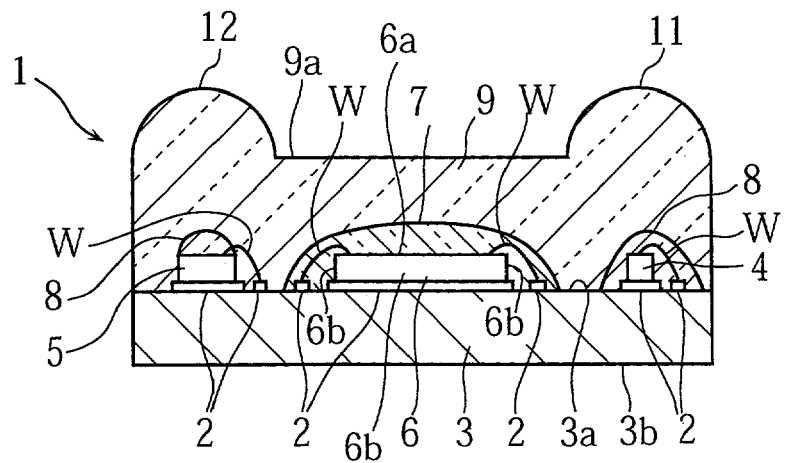
FIG. 1 is a sectional view illustrating the internal structure of an infrared data communication module embodying the present invention.
Figure 12:
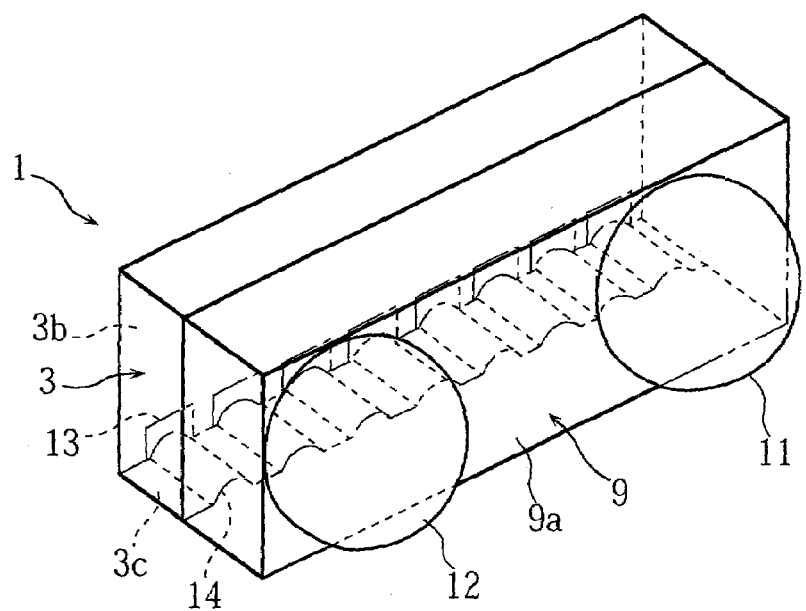
FIG. 12 is a perspective view showing the general structure of an infrared data communication module.
Figure 13:
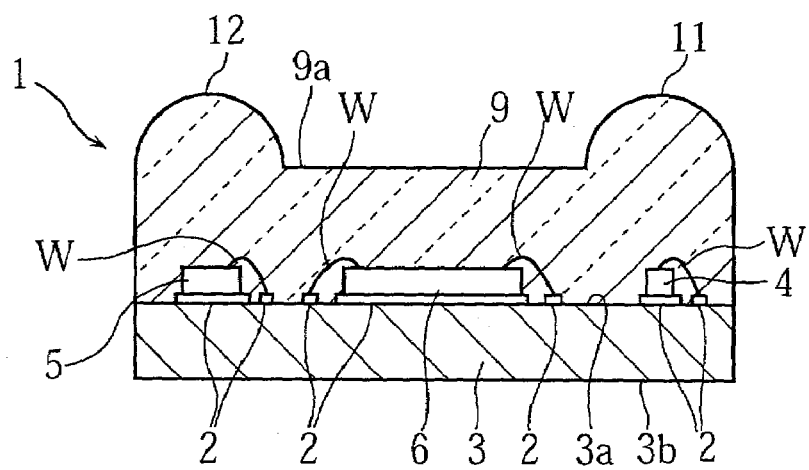
FIG. 13 illustrates the internal structure of a prior art infrared data communication module.

As shown in FIGS. 1 and 12, an infrared data communication module 1 (hereinafter, simply referred to as "module") embodying the present invention includes a generally rectangular substrate 3 having an obverse surface 3a on which are mounted a light emitting element 4, a light receiving element 5 and an IC element 6. The module 1 also includes a shield member 7 for shielding the IC element 6, two protective members 8 for covering the light emitting element 4 and the light receiving element 5, and a molded resin package 9 for integrally sealing these elements from above the substrate 3.

Figure 2:
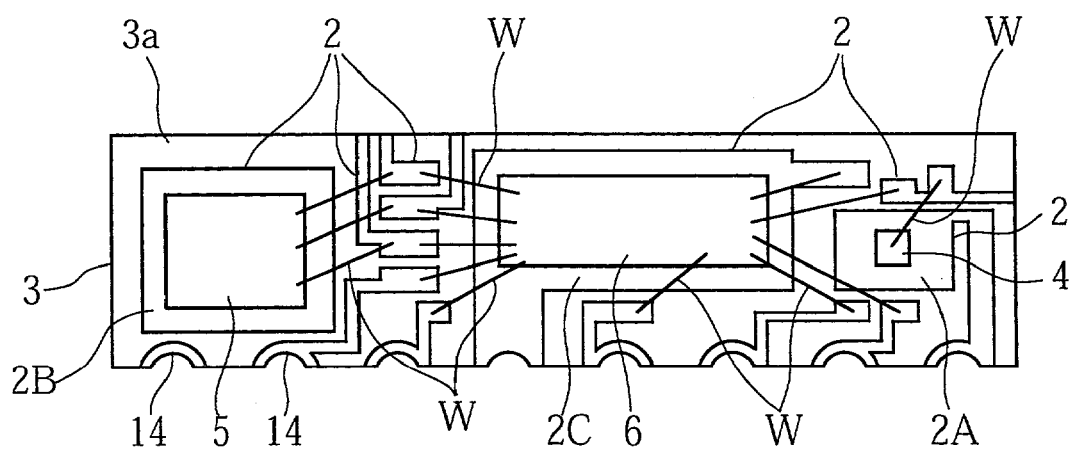
FIG. 2 is a plan view showing the substrate of the infrared data communication module of FIG. 1.

The substrate 3 may be formed of glass fiber-reinforced epoxy resin for example. Specifically, as shown in FIG. 2, the substrate 3 has an obverse surface 3a formed with a predetermined conductor pattern 2 which is partially gold-plated as required. The conductor pattern 2 includes portions which directly carries the light emitting element 4, the light receiving element 5, and the IC element 6. The conductor pattern 2 also includes other portions for connection to the elements 4, 5, 6 via wires W.

Figure 3:
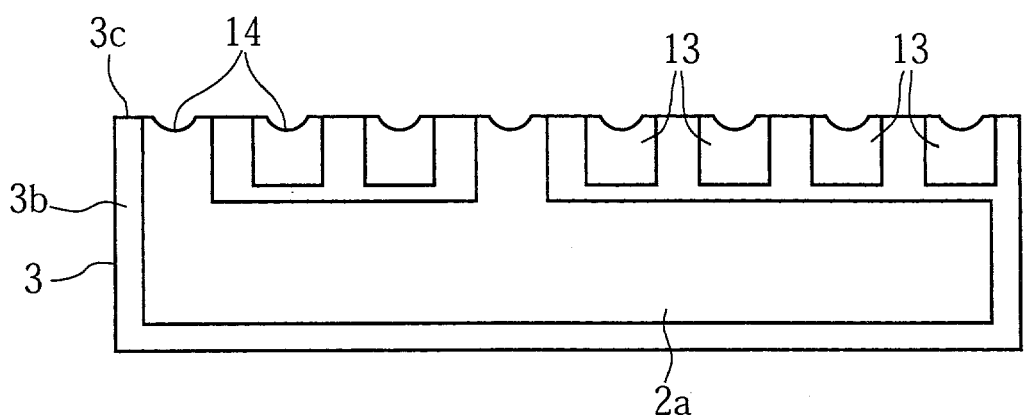
FIG. 3 is a plan view showing the reverse surface of the same substrate.

As shown in FIG. 3, the substrate 3 has a reverse surface 3b formed with a dummy conductor pattern 2a covering a major portion of the surface 3b, and connection terminals 13 for connection to an external circuit board (not shown) when the module is mounted onto the board. Further, the substrate 3 has a side surface 3c formed with grooves 14 each of which is generally arcuate in section. The groove 14 has an arcuate inner surface provided with a conductive layer (not shown) formed by copper-plating for example. The conductive layer electrically connects the conductor pattern 2 on the obverse surface 3a of the substrate 3 to the connection terminals 13 on the reverse surface 3b of the substrate 3.

Each of the obverse and the reverse surfaces 3a, 3b of the substrate 3 is formed with a protective insulating layer (not shown) called "green resist" at portions which need not be exposed to the outside. Therefore, the connection terminals 13 are not covered with such an insulating layer because the terminals are to be bonded to the non-illustrated circuit board by soldering.

The light emitting element 4, which may be a light emitting diode for example, is mounted onto a gold-plated first chip-bonding region 2A of the conductor pattern 2. The light emitting element 4 is connected to a selected portion of the conductor pattern 2 via a gold wire W.

The light receiving element 5, which may be a PIN photo diode for example, is mounted onto a second chip-bonding region 2B of the conductor pattern 2. The light receiving element 5 is connected to selected portions of the conductor pattern 2 via gold wires W.

The IC element 6, which is a rectangular parallelepiped chip, functions to control the infrared emission and reception of the light emitting element 2 and the light receiving element 3, respectively. The IC element 6 is mounted onto a third chip-bonding region 2C of the conductor pattern 2. The IC element 6 is connected to an appropriate portion of the conductor pattern 2 via a gold wire W. Further, though not fully illustrated, the IC element 6 is electrically connected to the light emitting element 4 and the light receiving element 5 via the gold wires W and the conductive pattern 2. Note that the IC element 6 of this embodiment incorporates an electronic circuit for preventing the influences of noises caused by electromagnetic waves.

Returning to FIG. 1, the shield member 7 is provided to prevent the IC element 6 from being adversely affected by the noises caused by light. The details of the shield member 7 will be described later.

The protective members 8 may be formed of a transparent resin such as a silicone resin for example. The protective members 8 may be formed by applying a silicone resin in a gel state to the light emitting element 4 and the light receiving element 5 followed by heating the resin to a predetermined temperature for hardening. Specifically, one of the protective members 8 is formed to fully enclose the light emitting element 4 together with the gold wire W connected thereto. The other protective member 8 is formed to cover only the upper surface of the light receiving element 5. The protective members 8 thus formed are elastomeric and capable of alleviating the stresses caused by the molding resin of the package 9.

The package 9 may be formed of a thermosetting resin (e.g. an epoxy resin) mixed with a pigment. The package 9 seals the above-described elements 4, 5, 6 from above the shield member 7 or the protective member 8. The package 9 has an upper surface 9a formed with a light emitting lens 11 at a location corresponding to the light emitting element 4 and a light receiving lens 12 at a location corresponding to the light receiving element 5. The package 9 blocks visible light while passing infrared light.

The shield member 7 is formed over the IC element 6 to cover an upper surface 6a and four side surfaces 6b of the IC element 6 for preventing light-attributable noises from reaching the IC element 6. That is, the shield member 7 covers all the surfaces of the IC element 6 except for the bottom surface contacting the substrate 3.

The shield member 7 may be formed by applying a light-shielding resin over the IC element 6 and then heating the resin to a predetermined temperature for hardening. The light-shielding resin contains a thermosetting resin such as an epoxy resin as a main ingredient, an oxide for absorptively blocking part of infrared light, a dye for absorptively blocking visible light, and carbon black as a black pigment for absorptively blocking part of ultraviolet light and part of infrared light. The oxide may be titanium oxide. An example of the dye may be an azo dye generally utilized for coloring fibers. Specifically, the light-shielding resin may contain 25-35 wt % of epoxy resin, 35-40 wt % of titanium oxide, 0.5 wt % of dye, 0.5-1.5 wt % of carbon black, 25-35 wt % of hardening agent, and so on.

The shield member 7 having the above-described composition is capable of absorptively shielding light in a wavelength range of about 100-1,200 nm. For example, a visible light in a wavelength range of about 300-780 nm is absorptively shielded by the dye, whereas infrared light in a wavelength range of about 780-1,000 nm is absorptively shielded by titanium oxide. Further, carbon black absorptively shields ultraviolet light in a wavelength range of about 100-300 nm and infrared light in a wavelength range of about 1,000-1,200 nm.

As shown in FIG. 1, the shield member 7 has a bulging upper surface and has a varying thickness lying in the range of 75-300 µm. At the apex of the bulge above the IC element 6, the shield member 7 should have a thickness of at least 75 µm, which has been found, through the experiments by the inventor, to be the smallest thickness capable of shielding light-attributable noises. Thus, the provision of the shield member 7 prevents light-attributable noises in the wavelength range of about 100-1,200 nm from reaching the IC element 6. Therefore, the IC element 6 is prevented from erroneously operating due to such light-attributable noises. As a result, the IC element 6 operates stably to control the operation of the light emitting element 4 and the light receiving element 5, thereby enhancing reliability of the module 1.

Figure 14:
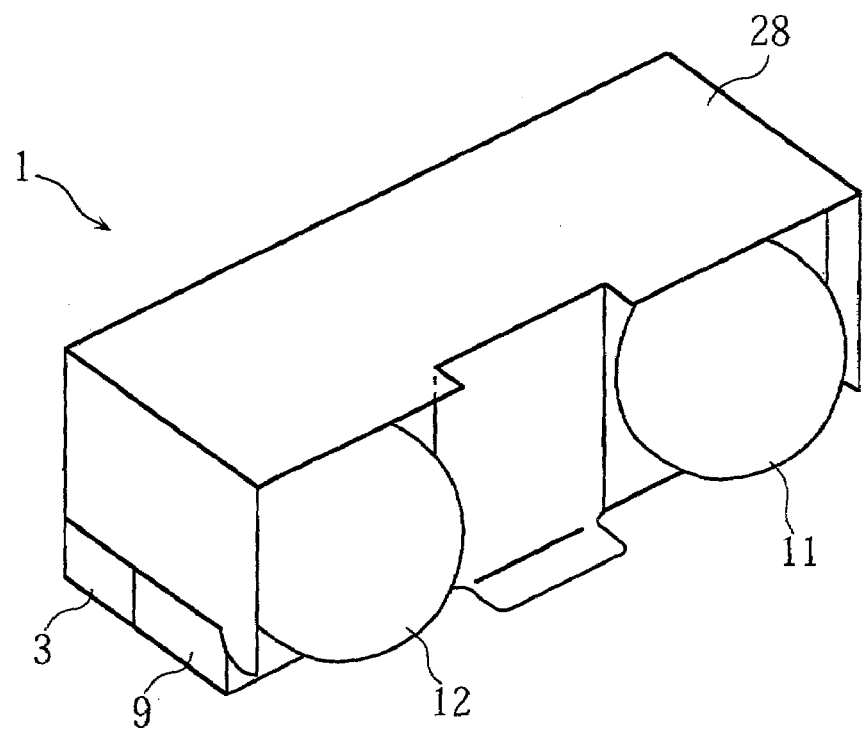
FIG. 14 is a perspective view showing a shield case attached the prior art infrared data communication module.

The provision of the shield member 7 eliminates the need for a shield case 28 (See FIG. 14) which has been conventionally used for preventing light-attributable noises from reaching the IC element 6. The elimination of the shield case 28, which is relatively expensive, reduces the cost for the parts of the module 1. Further, in the manufacturing process, the process step for attaching the shield case 28 to the module 1 can be eliminated, which contributes to the shortening of the manufacturing time and the reduction of the manufacturing cost. Moreover, since the shield member 7 formed mainly of a resin is used instead of the shield case 28 formed of a metal, the module 1 can also be reduced in weight, which facilitates the handling of the module 1.

Moreover, the resin package 9 seals the IC element 6 from above the shield member 7. Therefore, even when the molding resin expands or contracts in forming the package 9, the shield member 7 absorbs the stresses caused by the molding resin. Thus, as the protective members 8 protect the light emitting element 4 and the light receiving element 5, the shield member 7 also functions to protect the IC element 6.

The materials and composition of the shield member 7 is not limited to those described above. For example, for preventing light-attributable noises in the wavelength range of 300-1,000 nm, it is only necessary that the transparent resin for forming the shield member 7 contain at least an oxide for shielding infrared light and a dye for shielding visible light.

Figure 4:
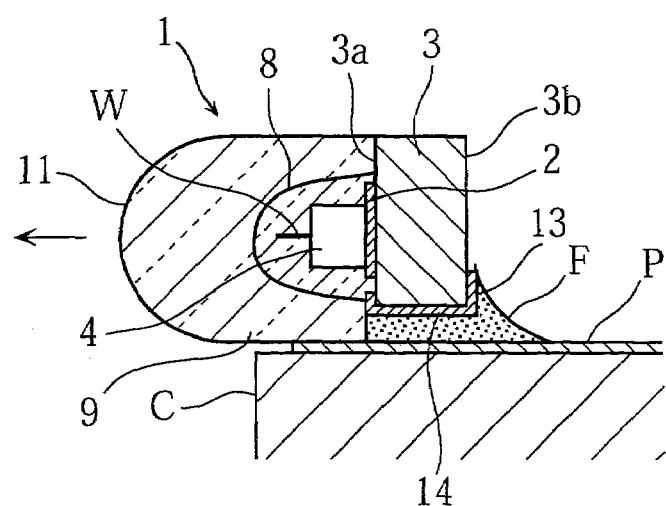
FIG. 4 illustrates the infrared data communication module as mounted on a circuit board.

In use, as shown in FIG. 4, the module 1 is mounted onto a circuit board C having a mounting surface formed with a wiring pattern P. The module 1 is so mounted that the reverse surface 3b of the substrate 3 stands perpendicularly to the mounting surface of the circuit board C. Specifically, the module 1 is bonded to the circuit board C via a solder, fillet F formed between each groove 14 connected to a corresponding connection terminal 13 and the wiring pattern P.

For performing infrared data communication, the light emitting element 4 emits infrared light upon receiving electric signals from the IC element 6, whereas the light receiving elements 5 outputs electric signals to the IC element upon receiving infrared light from the light emitting element 5.

Figure 5:
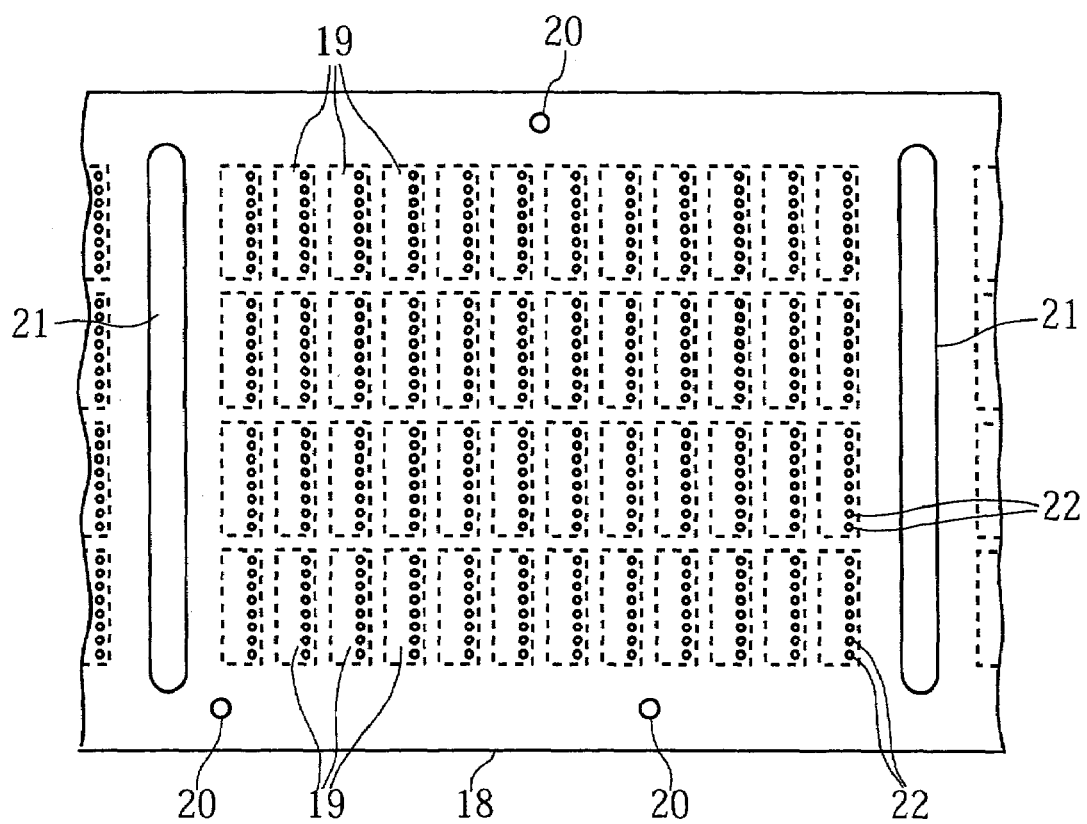
FIGS. 5 through 11 illustrate the successive process steps for making an infrared data communication module.

Next, a method for making a module 1 having the above-described structure will be described. First, as shown in FIG. 5, an elongate mother board 18 for providing a plurality of modules 1 is prepared. Specifically, the mother board 18 includes a plurality of substrate areas 19 which are arranged in a matrix and which later provides a corresponding number of substrates 3. The mother board 18 may be formed, at opposite sides thereof, with engagement holes 20 for fixing the mother board 18 in manufacturing the module 1. The mother board 18 is further formed with slits 21 extending widthwise of the mother board 18 and arranged at a predetermined pitch for preventing the mother board 18 from being adversely affected by warping.

Figure 6:
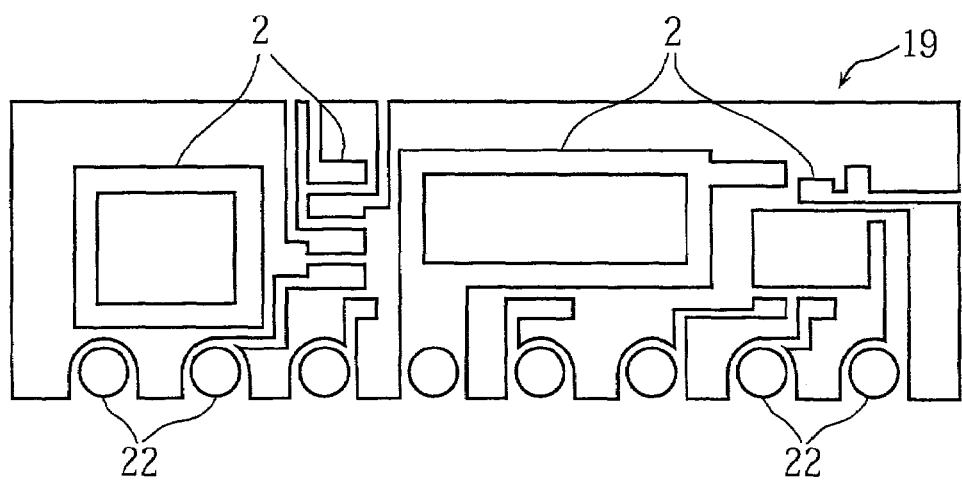

Subsequently, as shown in FIG. 6, a conductor pattern 2 is formed for each substrate area 19 on the obverse surface of the mother board 18 by known photolithography. Similarly, a predetermined conductor pattern (See FIG. 3) is formed on the reverse surface of each substrate area 19. The conductor pattern on the reverse surface includes a dummy conductor pattern 2a and connection terminals 13.

Specifically, the conductor pattern 2 is formed as follows. First, a conductor film such as a copper foil is formed on the obverse surface of the mother board 18, and a photoresist is applied to the conductor film. The photoresist is then exposed to light and developed using a mask formed with a predetermined pattern of openings. Then, unnecessary portions of the conductor film are removed by etching. As a result, a conductor pattern 2 is provided on each substrate area 19 on the obverse surface of the mother board 18.

Then, a plurality of through-holes 22 are formed at predetermined portions in each substrate area 19. The through-holes 22 later provide grooves 14 for electrically connecting the conductor pattern 2 on the obverse surface 3a to the dummy conductor pattern 2a and the connection terminals 13 on the reverse surface 3b of the substrate 3. The through-holes 22 may be formed before the formation of the conductor pattern 2.

Subsequently, by the photolithography, the obverse surface of each substrate area 19 is covered with an insulating film at portions which need not be exposed to the outside.

Specifically, the obverse surface of the mother board 18 is first entirely covered with an insulating film. Then, using a mask formed with a predetermined pattern of openings, the insulating film is exposed to light and developed. As a result, predetermined portions of the substrate area 19 are covered with the insulating film. Similarly, the reverse surface of each substrate area 19 is partially covered with an insulating film.

Figure 7:
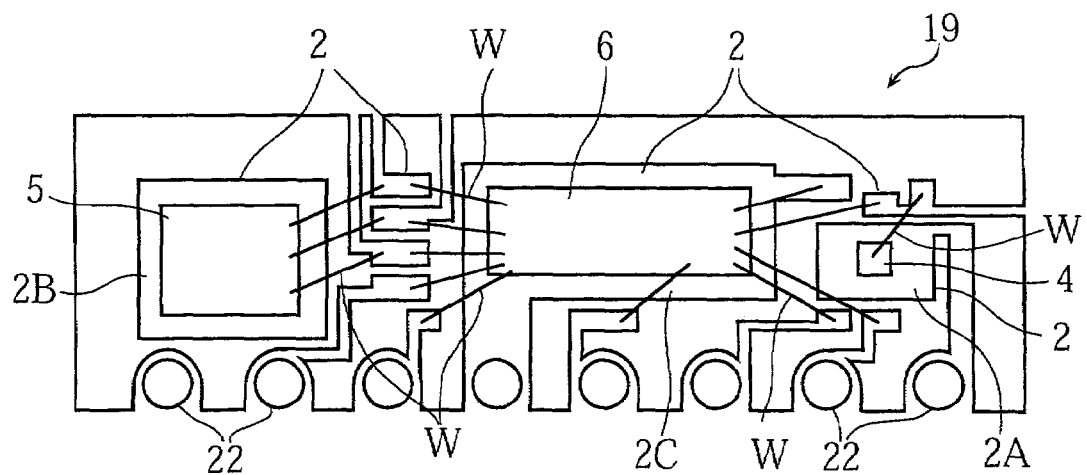

Subsequently, as shown in FIG. 7, a light emitting element 4, a light receiving element 5, and an IC element 6 are mounted at regions 2A, 2B, 2C, respectively, in the conductor pattern 2 of each substrate area 19, and wire bonding is performed with respect to the elements 4, 5, 6.

Figure 8:
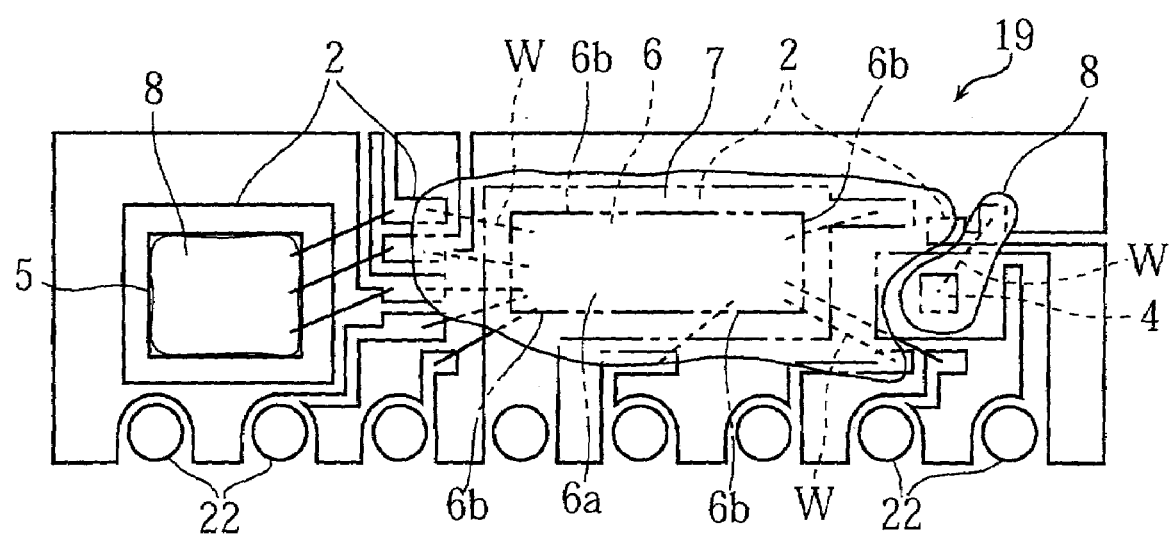

Then, as shown in FIG. 8, a shield member 7 is formed to cover the IC element 6 on each substrate area 19. Specifically, a light-shielding resin in a gel state is prepared by mixing, at a predetermined weight ratio, a resin (e.g. an epoxy resin), titanium oxide for absorptively blocking part of infrared light, a dye for absorptively blocking visible light, and carbon black for absorptively blocking part of ultraviolet light and part of infrared light. Subsequently, the light-shielding resin is applied to the IC element 6 to cover the upper surface 6 and the four side surfaces 6b of the IC element 6 as well as the wires W connected to the IC element 6 using a nozzle (not shown) capable of injecting light-shielding resin in a gel state. The light-shielding resin is then heated to a predetermined temperature for hardening, thereby providing a shield member 7. At this time, the shield member 7 is formed to have a thickness of at least 75 μm above the IC element 6.

Subsequently, protective members 8 are formed to cover the light emitting element 4 and the light receiving element 5 on each substrate area 19. Specifically, silicone resin is applied to cover the elements 4, 5 and the wires W connected thereto using a nozzle (not shown) capable of injecting silicone resin in a gel state. The silicone resin is then heated to a predetermined temperature for hardening, thereby providing the protective members 8.

The silicone resin for the protective members 8 and the light-shielding resin for the shield member 7 may be simultaneously heated for hardening. The protective members 8 may partially overlap the shield member 7. Alternatively, the shield member 7 may partially overlap the protective members 8 as long as it does not cover the upper surfaces of the light emitting element 4 and the light receiving element 5.

Figure 9:
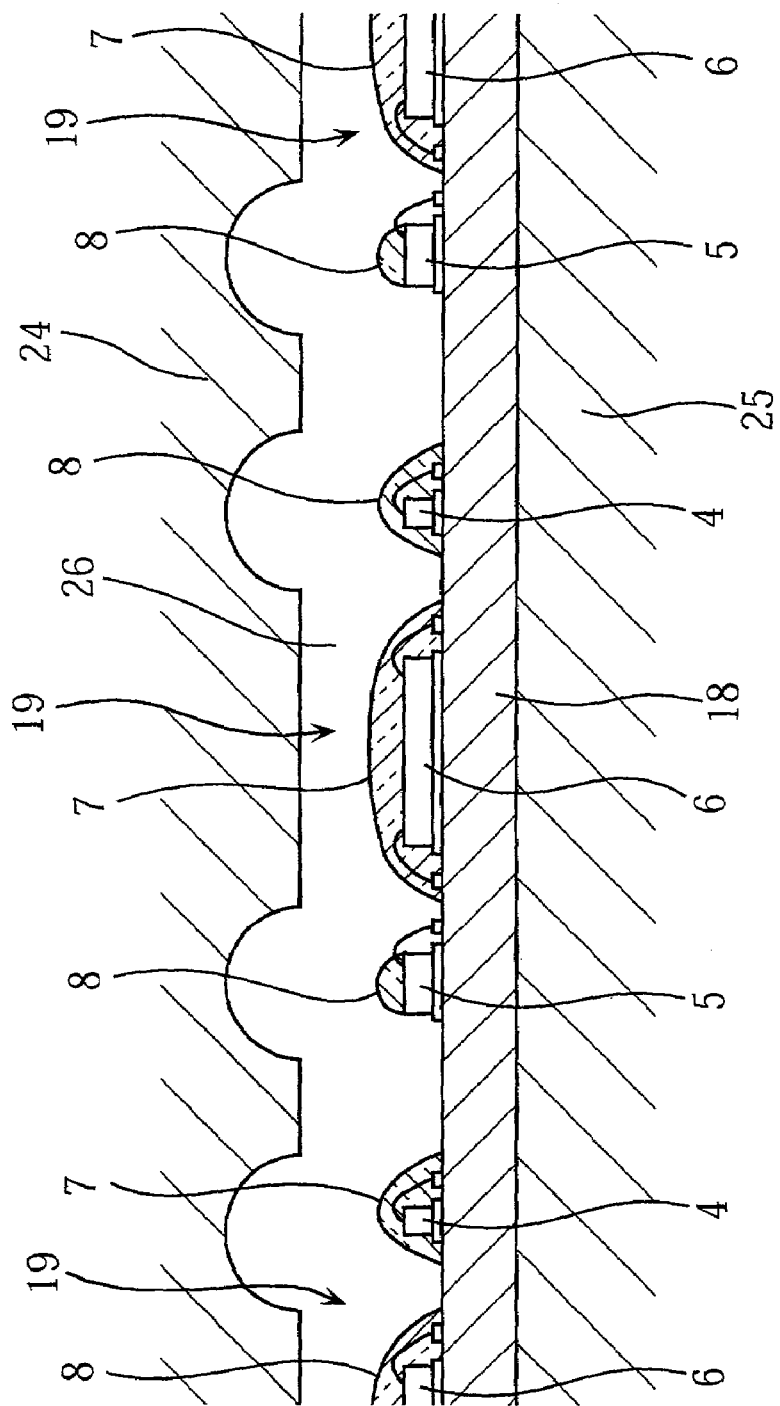
Figure 10:
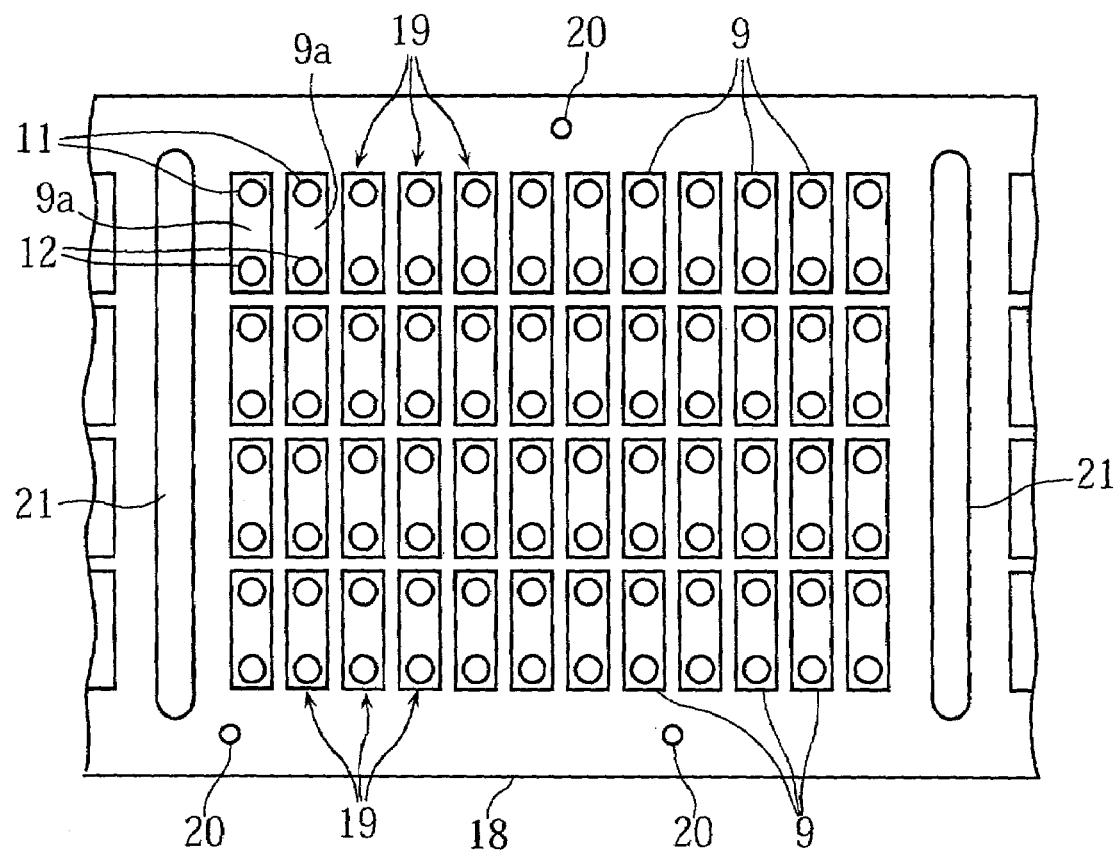

Then, an intermediate molded body, which later provides a plurality of resin packages 9 as shown in FIG. 10, is formed on the mother board 18 by transfer molding. Specifically, as shown in FIG. 9, the mother board 18 is disposed in a cavity 26 defined by an upper mold member 24 and a lower mold member 25. The upper mold member 24 includes generally semicircular recesses for forming light emitting lenses 11 and light receiving lenses 12. Then, an epoxy resin in a fluid state is injected into the cavity 26 and hardened, thereby providing an intermediate molded body which integrally seals the elements 4, 5, 6 from above the shield member 7 or the protective member 8. The intermediate molded body thus provided has an upper surface formed with generally semicircular light emitting lenses 11 and light receiving lenses 12.

Figure 11:
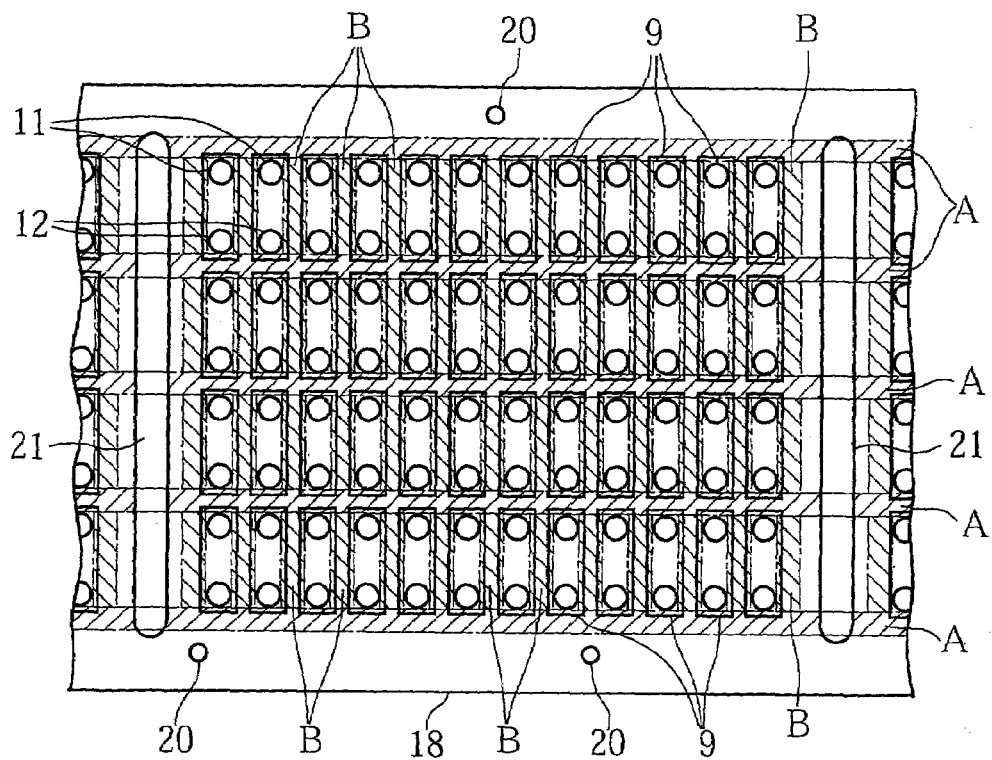

Thereafter, the mother board 18 together with the intermediate molded body is cut lengthwise and widthwise to provide a plurality of modules 1. Specifically, using a blade (not shown), the mother board 18 together with the intermediate molded body is cut lengthwise to remove the hatched portions A, thereby providing a plurality of elongated intermediate boards. Then, each of the intermediate boards is cut widthwise to remove the hatched portions B, thereby proving the plural modules 1 each enclosed in a package 9, as shown in FIG. 11.

In this way, according to the present invention, a plurality of modules 1 can be formed simultaneously, which contributes to a decrease in the manufacturing cost.

The present invention being thus described, it is apparent that the same may be varied in many ways. Such variations should not be regarded as a departure from the spirit and scope of the present invention, and all such modifications as would be obvious to those skilled in the art are intended to be included within the scope of the following claims.

The invention claimed is:

1. An infrared data communication module comprising:
a substrate having a first surface and a second surface opposite to the first surface, the first surface carrying a light emitting element, a light receiving element, and an IC element are mounted, the IC element controlling both of the light emitting element and the light receiving element;
an outer resin package formed on the substrate for integrally enclosing the light emitting element, the light receiving element and the IC element; and
an inner resin shield member formed within the outer resin package and outside the substrate for covering the IC element to protect the IC element against light-attributable noises, the inner resin shield member being held in direct contact with the IC element and the outer resin package.

2. The infrared data communication module according to claim 1, wherein the shield member is formed of a light-shielding resin containing an oxide for blocking infrared light and a dye for blocking visible light.

3. The infrared data communication module according to claim 2, wherein the light-shielding resin further contains carbon black for blocking part of infrared light and part of ultraviolet light.

4. The infrared data communication module according to claim 1, wherein the shield member entirely covers the IC element except for a surface thereof contacting the substrate.

5. The infrared data communication module according to claim 1, wherein the shield member has a varying thickness lying in a range of 50-300 μm.

6. The infrared data communication module according to claim 1, further comprising a protective member for covering the light emitting element.

7. The infrared data communication module according to claim 6, wherein the protective member entirely covers the light emitting element except for a surface thereof contacting the substrate.

8. The infrared data communication module according to claim 1, further comprising a protective member for covering the light receiving element.

9. The infrared data communication module according to claim 8, wherein the protective member covers only an upper surface of the light receiving element.

10. A method of making an infrared data communication module comprising a substrate having a first surface and a second surface, the first surface carrying a light emitting element, a light receiving element, and an IC element are mounted, the IC element controlling both of the light emitting element and the light receiving element; an outer resin package formed on the substrate for integrally enclosing the light emitting element, the light receiving element and the IC element; and an inner resin shield member formed within the outer resin package and outside the substrate for covering the IC element to protect the IC element from light-attributable noises, the inner resin shield member being held in direct contact with the IC element and the outer resin package; the method comprising the steps of:
 preparing a light-shielding resin by mixing a thermosetting resin with an oxide for blocking infrared light and a dye for blocking visible light;
 applying the light-shielding resin directly onto the IC element to cover the IC element; and
 heating the applied light-shielding resin for hardening.

11. The method according to claim 10, wherein the resin preparing step comprises adding carbon black to the thermosetting resin for blocking part of infrared light and part of ultraviolet light.

12. The method according to claim 10, wherein the resin applying step comprises applying the light-shielding resin in a gel state to the IC element using a nozzle.

* * * * *